United States Patent [19]

Tsuda et al.

[11] 4,339,717
[45] Jul. 13, 1982

[54] NUCLEAR MAGNETIC RESONANCE SPECTROMETER

[75] Inventors: Munetaka Tsuda; Hiroshi Yokokawa, both of Katsuta; Yoshiharu Utsumi, Tokyo, all of Japan

[73] Assignee: Hitachi, Ltd., Tokyo, Japan

[21] Appl. No.: 154,401

[22] PCT Filed: Dec. 8, 1978

[86] PCT No.: PCT/JP78/00045
§ 371 Date: Aug. 15, 1979
§ 102(e) Date: Aug. 15, 1979

[87] PCT Pub. No.: WO79/00412
PCT Pub. Date: Jul. 12, 1979

[30] Foreign Application Priority Data

Dec. 20, 1977 [JP] Japan .................. 52-153731

[51] Int. Cl.³ .................................................. G01N 27/00
[52] U.S. Cl. ........................................ 324/313; 324/308
[58] Field of Search .............. 324/300, 307, 308, 313

[56] References Cited

U.S. PATENT DOCUMENTS

| 3,034,040 | 5/1962 | Williams | 324/308 |
| 3,109,138 | 10/1963 | Varian | 324/313 |
| 3,510,832 | 5/1970 | Golay | 324/308 |
| 3,609,519 | 9/1971 | Seki | 324/313 |

Primary Examiner—Michael J. Tokar
Attorney, Agent, or Firm—Craig and Antonelli

[57] ABSTRACT

In a nuclear magnetic resonance spectrometer, this invention relates to an improvement of a lock system for stabilizing a magnetic field intensity. It is an object of the present invention to dissolve a low stability by using a conventional voltage control oscillator and a complex operation in the case of varying a reference material for locking. In the present invention, a radio frequency of a high stable reference frequency source is demultiplied by a variable frequency divider so that a frequency modulation or a modulation of the magnetic field is effected by the output thus demultiplied. When the reference material is changed, the operation can easily be made by varying the demultiplication ratio of the variable frequency divider.

2 Claims, 2 Drawing Figures

NUCLEAR MAGNETIC RESONANCE SPECTROMETER

TECHNICAL FIELD

This invention relates to a nuclear magnetic resonance spectrometer and specifically to a nuclear magnetic resonance spectrometer using a lock system in order to stabilize the magnetic field.

BACKGROUND ART

In a nuclear magnetic resonance spectrometer (hereinafter referred simply to as "NMR"), stabilization of the magnetic field is essential. Hereinafter the explanation on this necessity will be explained in the case of NMR for measurement of a hydrogen nucleus (magnetic field = 14 KG, frequency = 60 MHz). The range of distribution of the NMR signals of the hydrogen nucleus is about 10 ppm. This corresponds to 600 Hz in terms of frequency. On the other hand, the half value width of the resonance absorption spectrum is about 0.5 Hz. In order to obtain a stable spectrum, therefore, stability of about 0.1 Hz is necessary between the resonance frequency and the magnetic field. This value is about $10^{-9}$ of 60 MHz. The frequency source of NMR in this instance is a crystal oscillator having a stability of about $10^{-6}/°C$. and stability of magnetic force of the magnet is about $10^{-4}/°C$. Hence, the frequency source and the magnet are placed inside a thermostatic oven that is subjected to high accuracy temperature control. Further, magnetic shielding is applied to them. As a result, it becomes possible to obtain such a stability as required for the frequency source against the external temperature change or against the disturbance to the magnetic field. Yet, it is not possible to obtain sufficient stability required for the magnet. Hence, the variation of the NMR signal of a specific reference material is fed back as an error signal to the magnet or to the frequency source. The method of stabilizing the magnetic field using this feed-back is called the lock system of NMR. This lock system is divided into two groups; one being a homonuclear lock system using a specific NMR signal of a nuclide to be measured and the other being a heteronuclear lock system using an NMR signal of nuclide that is different from the nuclide to be measured.

In the abovementioned NMR for measuring the hydrogen nucleus, problems with the conventional method will now be explained with reference to the heteronuclear system using a solvent for duterium, by way of example. The resonance frequency of the deuterium nucleus is 9.2 MHz at the magnetic field intensity of 14 KG. Hence, a radio frequency of 9.2 MHz is irradiated onto a sample, which is placed in the magnetic field of 14 KG. The solvent for the sample has the deuterium nucleus. On the other hand, a modulation magnetic field of f KHz is applied to the sample. This frequency f is so set that (9.2 MHz + f KHz) becomes a resonance frequency of the deuterium nucleus used for locking. The NMR signal of the deuterium nucleus is converted into an audio frequency by a phase detector of 9.2 MHz. Further, the signal of this audio frequency is detected by a phase detector of f KHz. The output of this detector is an error signal corresponding to a deviation of the phase of f KHz. The magnetic field inensity is controlled by feeding back this error signal to a feedback coil of the magnet.

Now, the distribution range of the NMR signal of the deuterium nucleus in this instance is about 10 ppm (about 90 Hz). Accordingly, the resonance frequency of the deuterium nucleus varies depending on the kind of the solvent for deuterium used for locking. For this reason, an oscillator used for modulating the magnetic field is a voltage control oscillator. The oscillation frequency of this voltage control oscillator is changed by changing the value of a variable resistor. When the kind of the solvent for deuterium nucleus is changed, therefore, this variable resistor is adjusted.

The stability of the voltage control oscillator in this case is extremely low in comparison with that of the crystal oscillator. Hence, the accuracy in stabilizing the magnetic field becomes lower. In recent year, a method of measurement has been employed which takes an average of the NMR signals with respect to time in order to improve the signal sensitivity. For this reason, too, requirement for the stability over an extended period is ever-increasing.

In adjusting the variable resistor, calculation of the oscillation frequency in advance or calibration operation by monitoring the position of the duterium nucleus signal is necessary.

The abovementioned problems occur not only in the heteronuclear lock system but also in the homonuclear lock system.

DISCLOSURE OF THE INVENTION

It is an object of the present invention to provide a nuclear magnetic resonance spectrometer which enables to stabilize the magnetic field with a high level of accuracy.

It is another object of the present invention to provide a nuclear magnetic resonance spectrometer having improve performance.

In the present invention, a radio frequency is irradiated onto a reference material for locking and is then demultiplied by a variable frequency divider so that the frequency modulation or the modulation of the magnetic field is effected by the output thus demultiplied. The error signal arising from the resonance signal of this reference material is fed back for the purpose of stabilizing the magnetic field. Since the radio frequency irradiated onto the reference material and the modulation frequency have high stability in this case, it is possible to stabilize the magnetic field with a high level of accuracy. When the reference material for locking is changed, the switching operation of the resonance frequency can easily be made by varying the demultiplication ratio of the variable frequency divider.

BEST MODE FOR CARRYING OUT THE INVENTION

Figure 1:
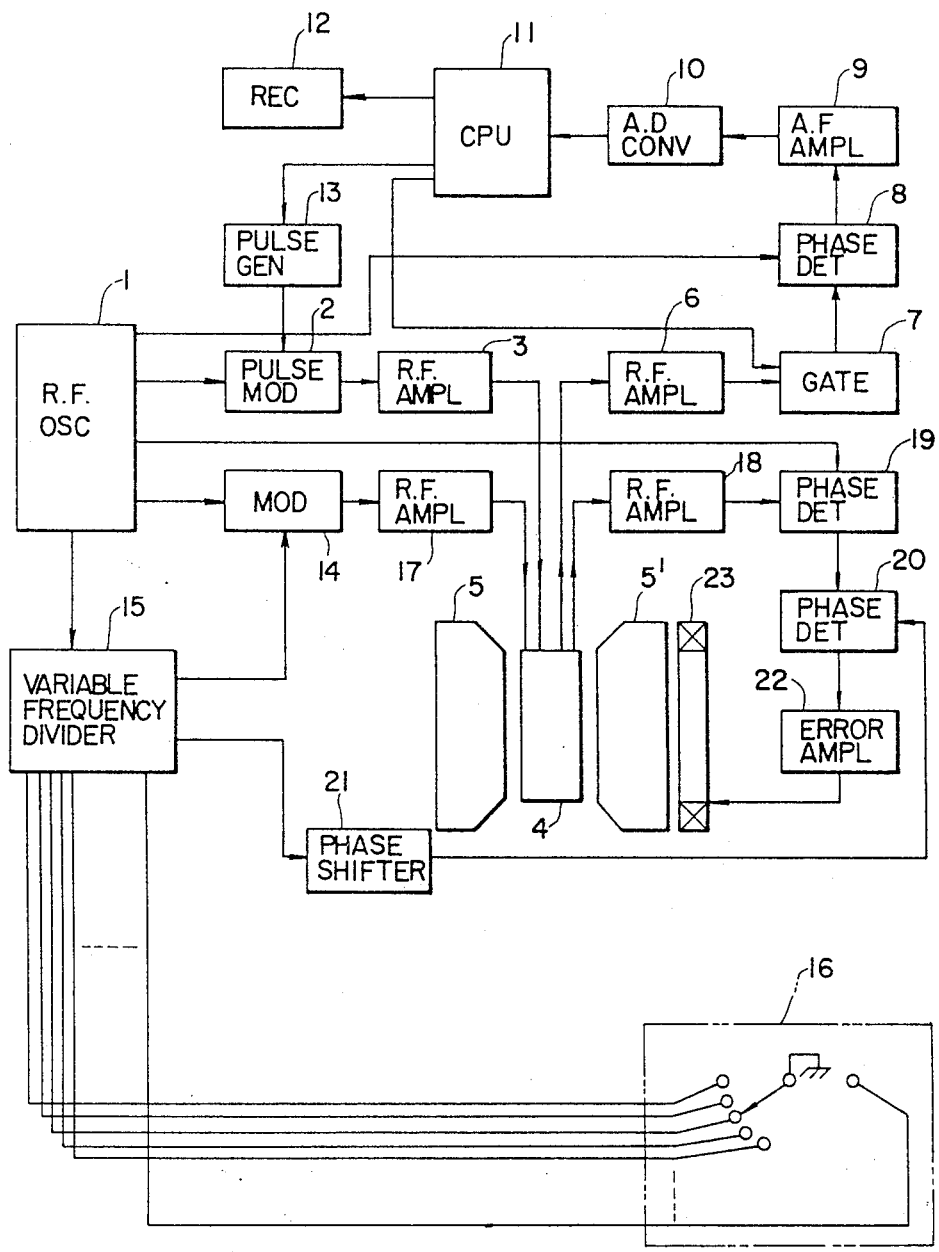
FIG. 1 is a block diagram showing an embodiment of the present invention.

An embodiment of the present invention will now be explained by referring to FIG. 1. Reference numeral 1 denotes a radio frequency oscillator which generates a signal of 60 MHz and a signal of 9.2 MHz. In other words, a crystal oscillator of 9.2 MHz as the master oscillator is incorporated in the radio frequency oscillator. The stability of this crystal oscillator is $10^{-6}/°C$. The signal of 9.2 MHz is multiplied by 6 times by a frequency multiplier. A signal of 5 MHz is mixed with the signal of 55 MHz formed by this frequency multiplier, thereby providing a signal of 60 MHz. This 60 MHz signal is applied as input to a pulse modulator 2. A pulse having a predetermined pulse width is also applied as input to this pulse modulator 2 from a pulse generator 13. Accordingly, the 60 MHz signal is pulse-modulated in the pulse modulator 2 by the pulse generated as output from the pulse generator 13. The pulse width and the repetition interval of the pulses generated by the pulse generator 13 are controlled by a computor 11. The radio frequency pulse is amplified by a radio frequency power amplifier 3, and is irradiated onto the sample for measurement via a atransmitter coil inside a probe 4. The probe 4 is interposed between a pair of magnets 5 and 5'. The magnetic field intensity of the magnets is 14 KG. The free induction decay signal (hereinafter referred to as the FID signal) obtained from the sample for measurement by the irradiation of the radio frequency pulse is detected by a receiver coil inside the probe 4. The FID signal is amplified by a radio frequency amplifier 6. A gate circuit 7 is controlled by the computor 11 in such a manner that it allows the passage of the signal only in the period except the irradiation period of the radio frequency pulse. The FID signal passing through the gate circuit 7 is applied as input to a phase detector 8. The 60 MHz signal from the radio frequency oscillator 1 is input to the phase detector 8 as the reference signal. Accordingly, the FID signal, that is converted into an audio frequency, is generated as output from the detector 8. This FID signal is amplified by an audio frequency amplifier 9 and converted into a digital signal by means of an analog-digital convertor 10. This digital signal is taken into the computor 11. The FID signal, which is once written into the memory of the computor 11 and is a time-axis signal, is subjected to the Fourier transformation and is changed into a frequency axis signal. This frequency axis signal is recorded on a recorder 12 as an NMR signal. If necessary, this signal is integrated several times. The foregoing explanation deals with the measuring system of the ordinary Fourier transforme type NMR.

Next, the explanation will be given on the lock system. The 9.2 MHz signal is applied as input to the modulator 14 and to the variable frequency divider 15 from the radio frequency oscillator 1. The 9.2 MHz signal applied as input to the variable frequency divider 15 is divided into a signal of (5 KHz+g Hz) and the divided signal is in turn applied as input to the modulator 14. Accordingly, the output signal of the modulator 14 is a signal which is produced when the 9.2 MHz signal is modulated by the (5 KHz+g Hz) signal. The frequency g Hz in this modulation frequency can be changed by switching a change-over switch 16. The resonance frequency of the duterium nucleus used for locking is (9.2 MHz+5 KHz+g Hz). The output signal of the modulator 14 is amplified by a radio frequency power amplifier 17. The amplified signal is irradiated onto the sample for measurement from the transmitter coil inside the probe 4. The solvent for the duterium for locking is used also as the solvent for the sample for measurement. The resonance signal obtained from the solvent for the sample for measurement is amplified by a radio frequency amplifier 18. The amplified signal is detected in a phase detector 19 by the 9.2 MHz signal from the radio frequency oscillator 1. The (5 KHz+g Hz) signal thus detected is applied as input to a detector 20. After its phase is shifted by 90 degrees by a phase shifter 21, the (5 KHz+g Hz) signal generated as output from the variable frequency divider 15 is impressed as input to the detector 20. Accordingly, the dispersion signal is generated as an error signal from the detector 20. This error signal is amplified by an error amplifier 22 and applied to a feedback coil 23. The feed-back is carried out so that the error signal becomes zero thereby to control the magnetic field intensity.

Figure 2:
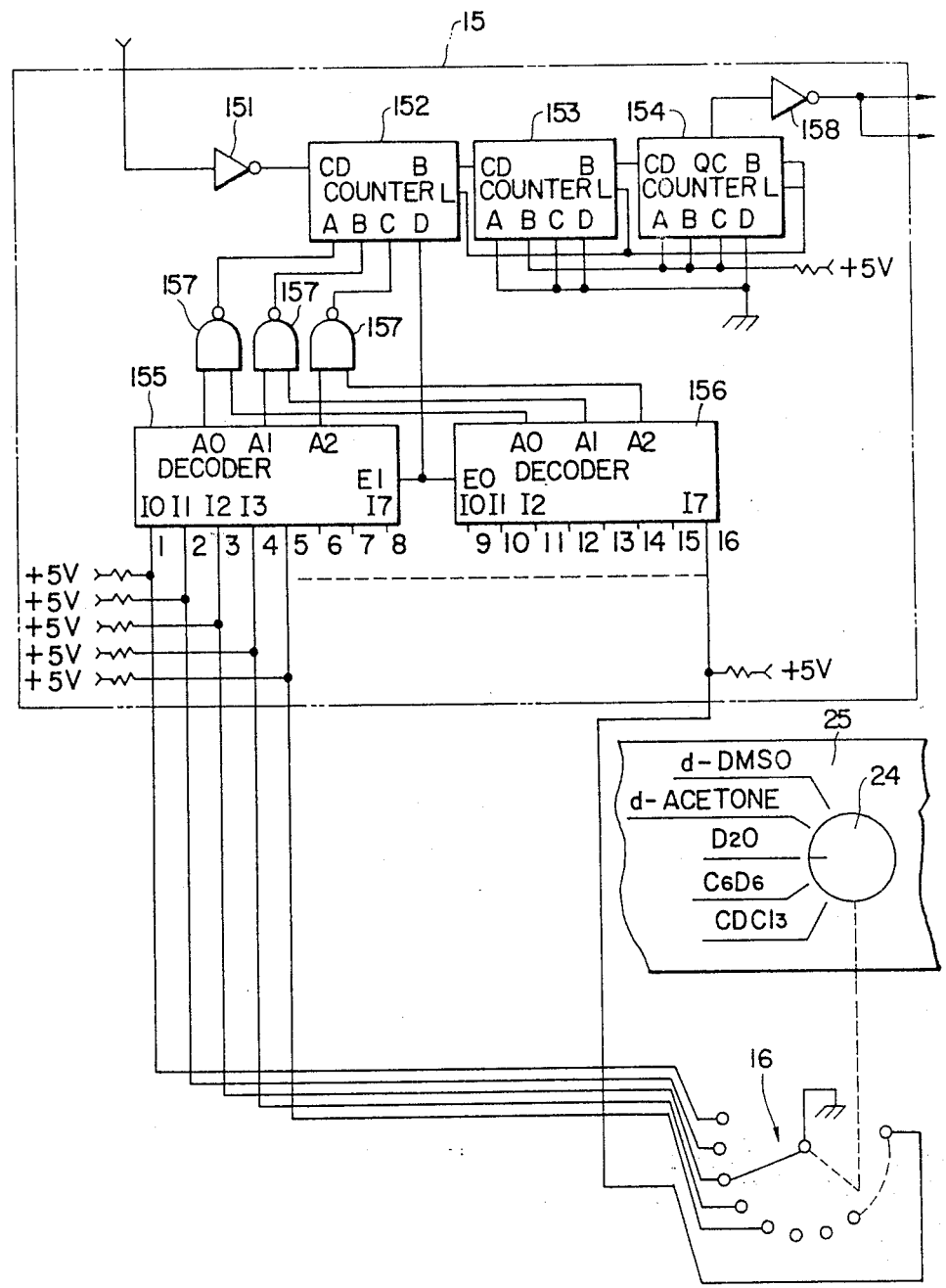
FIG. 2 is a circuit diagram of the variable frequency divider of an embodiment of the present invention.

Next, the construction of the variable frequency divider 15 will be explained by referring to FIG. 2. Various solvents are available as the solvent for duterium. The resonance frequency of chloroform-d (CDCl$_3$), for example, is 9.212764 MHz at 14,100 KG. In this case, the master oscillator of the radio frequency oscillator 1 accurately has an oscillation frequency of 9.207760 MHz. Accordingly, it is possible to obtain the resonance frequency of 9.212764 MHz by adjusting the output of the variable frequency divider 15 to 5.004 KHz. In other words, when CDCl$_3$ is used as the solvent, the demultiplication ratio of the variable frequency divider 15 may be set to 1/1840. In FIG. 2, reference numeral 151 designates an invertor and numerals 152, 153 and 154 do 4-bit up-down counters, respectively. These up-down counters use HD 74193, a product of Hitachi Ltd. Reference numerals 155 and 156 represent octal-to-binary decoders, respectively. They are HD 74148, a product of Hitachi Ltd. Reference numeral 157 represents a nand circuit. The decoders 155, 156 and the nand circuit 157 together form a hexadecimal-to-binary decoder. The inputs I0, I1, ... I7 of the decoders 155, 156 are generally at "1" level. When the change-over switch 16 is changed over to the input I0 of the decoder 155, the input I0 becomes "0" level. At this time the level of A0, A1 and A2 of the decoders 155, 156 are "1" while the level of E1 is "0". Hence, the inputs A, B, C and D of the counter 152 become "0" level, respectively. On the other hand, the inputs A, C and D of the counter 153 are set in advance to "0" level and the input B is set in advance to "1" level. Further, the inputs A, B and C of the counter 154 are set in advance to "1" level and the input D, to "0" level. The demultiplication ratio (1840) of the chloroform-d in this instance is "730" in terms of the hexadecimal notation. In other words, the counters 154, 153 and 152 are respectively set to "7", "3" and "0" in order named. A pulse is impressed as input to a count-down terminal CD of the counter 152 from the master oscillator of the radio frequency oscillator 1. Since the counter 152 is set to "0", a pulse is generated as output from a borrow terminal B when 16 pulses are counted. The content of the counter 153 is changed by this pulse from "3" to "2". Whenever the counter 152 counts 16 pulses, a pulse is generated as output from the borrow content B. When the content of the counter 153 becomes "0", a pulse is generated from a borrow terminal of the counter 153. This pulse changes the content of the counter 154 from "7" to "6". Whenever the counter 153 counts 16 pulses, a pulse is generated from the borrow output. When the content of the counter 154 becomes "0", a pulse is generated from the borrow terminal and a QC terminal. This pulse is generated whenever 1840 pulses are applied as input to the counter 152. The output pulse of the borrow terminal B is impressed as input to load terminals L of the counters 152, 153, 154 whereby the contents of the counters are loaded.

The QC output of the counter 154 is inverted by an inverter 158. As the abovementioned actions are repeated, the counter 154 produces one pulse from the QC terminal whenever 1840 input pulses are applied to the CD terminal of the counter 152. In other words, the 9.2 MHz radio frequency signal is demultiplied by the variable frequency divider 15 into the 5.004 KHz signal, more accurately into the 5.00422 KHz signal. This signal is deviated by 0.22 Hz from the practical resonance signal of chloroform-d. As a result, the magnetic field intensity is controlled to a value which is deviated by 0.22 Hz from the original value. However, the frequencies used for the purpose of lock are 9.2 MHz of the crystal oscillator as the master oscillator and 5 KHz that is obtained by dividing this 9.2 MHz frequency, and each has stability of $10^{-6}/°C$. Accordingly, when the measurement is carried out repeatedly, the deviation of the magnetic field intensity is always constant. In conjunction with the NMR spectrum as the frequency axis signal, this means that the frequency as the axis of abscissa is constantly deviated by a predetermined quantity. When the NMR spectra are integrated by repetition of the measurement, broadening of the peak width due to unstability of the axis of abscissa does not occur. In recording the NMR spectra onto a recorder or the like, the deviation of the axis of abscissa can be compensated for either manually or automatically. This compensation method will later be described.

When the solvent for duterium is changed, change of the locking frequency can be made by turning a knob 24 fitted onto the operation panel of the NMR spectrometer. A label 25 is put below the knob 24 on the operation panel in order to mark the name of the solvent for duterium used for locking. When the solvent is changed from chloroform-d to duterium oxide $D_2O$, for example, the knob is to be turned to the position of $D_2O$ on the label 24. In this case, the change-over switch 16 sets the input 17 of the decoder 155 to "0" level. The resonance frequency of duterium oxide is 9.212745 MHz. Hence, the demultiplication radio of the variable frequency divider 15 is to be set to 1/1847 (to 737 in the hexadecimal notation). The resonance frequency of dimethylsulfoxide-$d_6$[$(CD_3)_2SO_4$] is 9.212723 MHz. Hence, the demultiplication ratio of the variable frequency divider 15 is to be set to 1/1855 (73F in the hexadecimal notation) in this case. The abovementioned three kinds of solvents are very often used as the solvent for duterium.

For solvents for duterium in general including acetone-$d_6$ [$(CD_3)_2CO$] and benzene-$d_6$ ($C_6D_6$) that are put on the label 25, the demultiplication ratio of the variable frequency divider 15 may be 1/73X (where X is O−F). Accordingly, the values of the counters 153, 154 of the variable frequency divider 15 in FIG. 2 are set respectively to "7" and "3". However, when acetic acid-$d_4$ ($CD_3COOD$) or the like is used as the solvent, it is necessary to change the second digit of the demultiplication ratio. The circuit configuration in such a case may as well be that of the input circuit for the counter 152 shown in FIG. 2.

Next, the explanation will be given on the compensation method of the deviation of the axis of abscissa when the NMR spectra are recorded onto a recorder or the like. The deviation of the locking frequency is 0.22 Hz in the case of chloroform-d and this deviation is about 0.02 ppm in terms of the frequency axis of the NMR spectra and is a slight deviation. The deviation can manually be compensated in the following manner. An ordinary NMR spectrometer is equipped with a CRT display. Hence, the NMR spectral signals stored in the memory are displayed on the CRT. Thereafter the luminous point is displayed on the CRT. An optional peak is selected from the NMR spectra displayed on the CRT. The example of the peak to be selected is tetramethylsilane (TMS). The luminous point is moved along the axis of abscissa through the adjustment of the volume till it is in conformity with the peak of TMS. The quantity of movement of the luminous point till it coincides with that of TMS is written into the computor. The addresses of the memories of the computor and the axis of abscissa of the NMR spectra are arranged in advance so as to correspond to one another. It will therefore be assumed that No. 100 address of the memory corresponds to 0 ppm of the NMR spectrum. The moving quantity of the luminous point to be read into the computor also corresponds to the displacement of the address. When the moving quantity of the luminous point corresponds to 10 addresses, for example, the computor judges that No. 110 address corresponds to 0 ppm of the NMR spectrum. In recording the NMR spectra onto a recorder, the data of the No. 110 address are output at the position of 0 ppm of the recording sheet.

Next, the explanation will be given on the automatic compensation method of the deviation. The deviation of the locking frequency in the system shown in FIG. 2 is maximum±1.355 Hz. For compensating for the deviation using the peak of TMS, the data of the addresses in the range corresponding to±0.2 ppm, for example, are compared with the address of the memory corresponding to 0 ppm of the NMR spectrum in order to detect the address having the peak data. It is possible to judge the abovementioned peak data as the peak of TMS since there is generally no other peak within the range of±0.2 ppm than the peak of TMS. In recording the NMR spectra on the recorder, the data located at the address of the abovementioned peak data is generated as output to the position of 0 ppm on the recording sheet.

The foregoing explanation covers the case where duterium lock is carried out in a Fourier transforme type NMR spectrometer for the measurement of hydrogen nucleus having the frequency of 60 MHz and the magnetic field intensity of 14 KG. However, the values of the frequency and the magnetic field intensity may be optional and the invention can be similarly applied to an NMR spectrometer of 90 MHz−21 KG type. The nuclide to be measured may be a carbon nucleus or a fluorine nucleus in addition to the hydrogen nucleus. Further, the nuclide used for locking may also be fluorine besides duterium. In the Fourier transforme type NMR spectrometer, it is difficult to employ the homonuclear locking system using a nucleus which is the same as the nucleus to be observed. Hence, the invention is specifically effective for the heteronuclear locking system. In a NMR spectrometer of the CW system, the present invention is effective if the locking frequency can be fixed. Though the resonance frequency of the duterium nucleus used for locking is changed over in the above-described embodiment, the frequency of the measuring system may be changed over while the frequency of the locking system is fixed at a predetermined value. In the embodiment described above, the frequency modulation is carried out by means of the modulator 14. However, modulation of the magnetic field may be carried out by means of a modulation coil wound onto the magnet. In the detector 20, the error signal is obtained as the dispersion signal by carrying out the detection while the pase is deviated by 90 degrees, but this may be an absorption signal. Further-more, the locking system may be an internal lock or an external lock.

I claim:

1. A nuclear magnetic resonance spectrometer comprising: means for generating a unidirectional magnetic field; means for placing a sample and a reference material in said unidirectional magnetic field; means for generating a radio frequency; means for supplying said radio frequency to said sample and to said reference material; means for detecting the resonance signal obtained from said sample and obtaining a nuclear magnetic resonance spectrum; a variable frequency divider capable of optionally dividing the frequency of said radio frequency; means for modulating one of said radio frequency irradiated to said reference material and said magnetic field in accordance with the output signal of said variable frequency divider; means for obtaining an error signal from the resonance signal obtained from said reference material; and means for controlling the intensity of said magnetic field on the basis of said error signal.

2. The nuclear magnetic resonance spectrometer as defined in claim 1 further including a switching mechanism for switching the demultiplication ratio of said variable frequency divider to a predetermined demultiplication ratio.

* * * * *